United States Patent [19]

Romanczuk et al.

[11] 4,338,652

[45] Jul. 6, 1982

[54] STACK MODULE AND STACK LOADER THEREFOR

[75] Inventors: Walter N. Romanczuk, Buffalo; Paul J. Reiter, West Seneca; William R. Watkins, Colden, all of N.Y.

[73] Assignee: Westinghouse Electric Corp., Pittsburgh, Pa.

[21] Appl. No.: 283,707

[22] Filed: Jul. 16, 1981

Related U.S. Application Data

[63] Continuation of Ser. No. 124,689, Feb. 26, 1980, abandoned.

[51] Int. Cl.$^3$ ............................................. H05K 7/20
[52] U.S. Cl. ...................................... 361/388; 357/76
[58] Field of Search ................. 174/16 HS; 165/80 R, 165/80 A, 80 B; 357/75, 76, 81; 361/386, 388, 381–383

[56] References Cited

U.S. PATENT DOCUMENTS

| | | | |
|---|---|---|---|
| 2,761,216 | 9/1956 | Gollut | 73/141 A |
| 2,891,399 | 6/1959 | Rufolo | 73/141 A |
| 3,447,118 | 3/1969 | Ferree | 338/21 |
| 3,523,215 | 8/1970 | Steinmetz, Jr. | 361/386 |
| 3,603,381 | 9/1971 | Scherbaum | 357/81 |
| 3,605,491 | 9/1971 | Senn | 73/141 A |
| 3,740,618 | 6/1973 | Vogel | 29/589 |
| 3,864,607 | 2/1975 | Phillips | 361/386 |
| 3,943,426 | 3/1976 | Thiele | 336/175 |

FOREIGN PATENT DOCUMENTS

50-112736  9/1975  Japan.

*Primary Examiner*—Gerald P. Tolin
*Attorney, Agent, or Firm*—C. M. Lorin

[57] ABSTRACT

A packaged stack of flat electrical components is held under controlled pressure in its supporting frame by a stack loader calibrated for applying the exact force required for good thermal and electrical contact. The stack is lowered or raised in the supporting frame by the stack loader. Stoppers on the supporting frame permit by lowering of the stack to disjoin the electrical components and make any device accessible for maintenance, testing or replacement. By choosing a progressive degree of displacement downward the electrical devices become accessible one after the other.

2 Claims, 11 Drawing Figures

STACK MODULE AND STACK LOADER THEREFOR

This is a continuation of application Ser. No. 124,689, filed Feb. 26, 1980, and now abandoned.

BACKGROUND OF THE INVENTION

The invention relates to stack modules for supporting and containing a plurality of flat packaged electrical devices, in particular semiconductor devices such as thyristors or rectifiers, which are to be maintained under pressure for good thermal and electrical conduction.

Typical stack modules of the prior art are described in U.S. Pat. No. 3,523,215 of J. J. Steinmetz et al. and No. 3,447,118 of H. E. Ferree. The stack module of the aforementioned patents include upper and lower members connected by vertical tension members for holding a stack of thyristors each sandwiched between two heat sinks. An adjustable force is applied to the top of the stack through the center of the upper member through adjustable force means including bolt, nut and spring structures.

In the stack module of the prior art, the alternate heat sinks are used as connecting elements for the electrical power, and also as thermal conductors. They are generally made of solid copper, and are very heavy. Each semiconductor device usually lay on the upper surface of the adjacent lower heat sink in good mechanical, thermal and electrical contact, and so does the adjacent upper heat sink when mounted on top of the sandwiched semiconductor device. This makes a heavy stack of parts of which the heat sinks are held by connectors to the busses and feeders of the bridge of semiconductor devices. It appears that a problem with the stack modules of the prior art occurs when a semiconductor devices has to be tested, taken away, and/or replaced. Up to now for maintenance the entire stack module had to be dismantled so that one can recognize and reach a defective semiconductor device.

SUMMARY OF THE INVENTION

An object of the present invention is to provide a stack module which allows to withdraw and replace one semiconductor at a time, thus without having to dismantle the stack assembly.

Another object of the invention is to be able to apply an adjustable force on a stack module or to release such force while disjoining the semiconductor devices to such an extent that any of them can be slided out of the stack.

A further object of the invention is to release the adjustable force applied to the stack in such a way that disjoining of the semiconductor devices is effected selectively so that one particular semiconductor device can be slided out of the stack without unnecessarily loosening all the others.

According to the present invention, the aforementioned objects are achieved collectively or individually by adjustable force applying means operable at the bottom of the stack to lower or raise the stack in its assembly frame in from the stoppers which can register with the respective heat sinks. When the stack is lowered and a stopper retains an upper heat sink, the adjacent electrical device resting on the lower heat sink is lowered and the device can be taken from the gap so created.

The invention also bears on a stack loader used for raising and lowering the stack units assembly, in the maintenance mode, and for applying a calibrated force to the stack in the operating mode.

The stack loader according to the invention is self-centering and engages the stack at the bottom when a bolt threaded at the center of the lower member is pushed forward.

The stack loader is a telescopic arrangement includes two parts mounted with spring washers in between, where those two parts at rest define a certain spacing between two edges thereof providing a sight or which can be felt by mere touch in order to ascertain when the spacing is reduced by tightening of the stack loader with the bolt up to a point where an exact calibrated force has been applied to the stack components of the module which is, at this time, in its operating mode.

DESCRIPTION OF THE PREFERRED EMBODIMENTS

Figure 1:
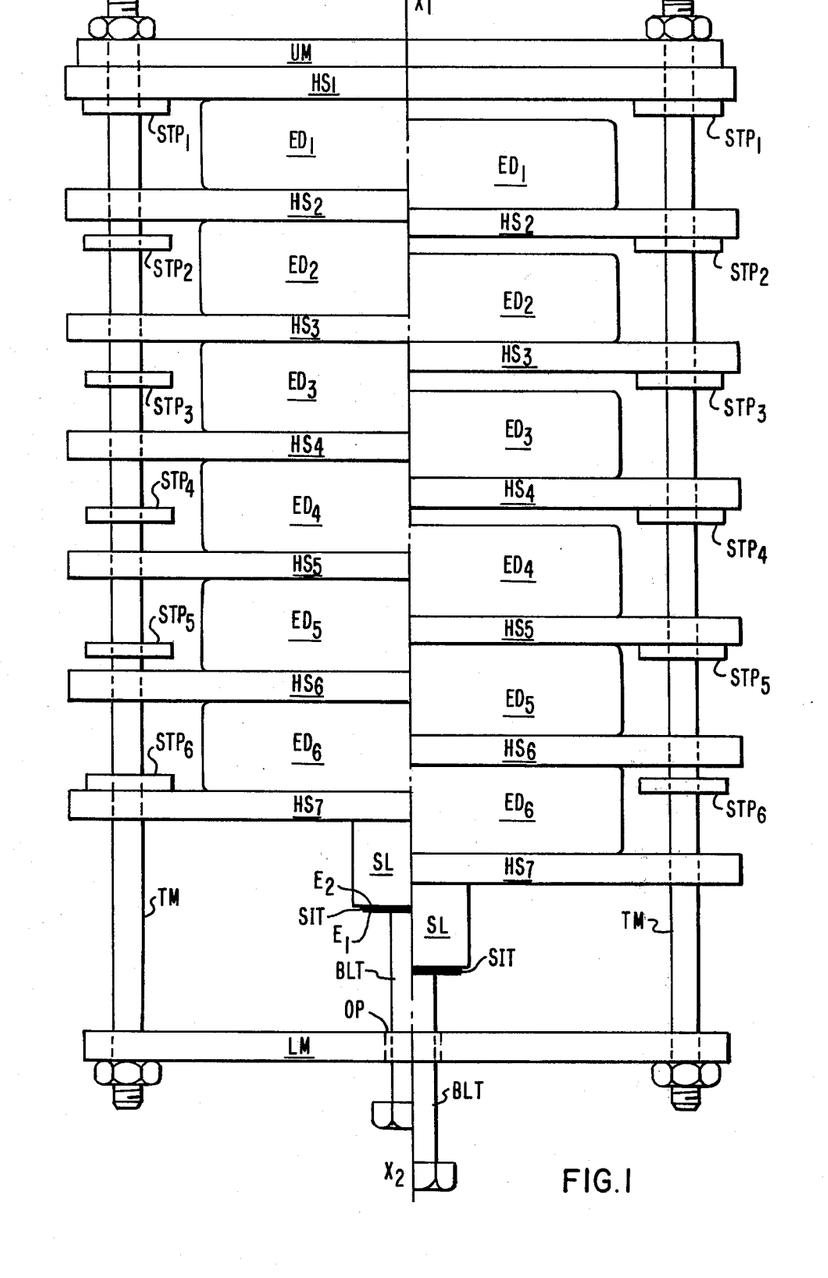
FIG. 1 shows schematically the stack module according to the present invention for two different positions. To the left, the stack is totally raised short of applying the adjustable force to the stack components; to the right, the stack is partially lowered so as to provide access to four of the seven electrical devices illustrated in the embodiment.

Referring to FIG. 1, a stack module for flat package semiconductor devices is schematically shown comprising: (1) a stack of six electrical devices $ED_1$–$ED_6$, each sandwiched between two adjacent heat sinks ($HS_1$–$HS_7$); (2) a support for said stack including upper and lower members (UM, LM) at the top and bottom of the stack, respectively, and vertical tension members TM rigidly connecting the corresponding ends of the upper and lower members; (3) a telescopic stack loader (SL, BLT) for applying an adjustable force F axially of said stack and upwardly from beneath the stack against the upper member UM; (4) stoppers $STP_1$–$STP_6$ mounted on said tension members TM and disposed at difference levels in the interspace defined between consecutive heat sinks for retaining the upper heat sink when, as shown on the right side of FIG. 1, the stack has been lowered by the stack loader sufficiently so that an upper heat sink engages an adjacent stopper located beneath it.

This arrangement allows: (a) applying an adjustable force to the stack between the upper and lower members so as to obtain the required thermal and electrical contact between the electrical devices and the heat sinks when the stack module is being tightened, but not excessively as it would damage some of the electrical devices. By releasing the pressure and lowering the stack along the longitudinal axis $X_1$, $X_2$ of its support thereby allowing the stack to open successively from one stopper to the next, freeing any electrical device that has to be inserted or changed at any selected level, depending upon the degree of withdrawal of the stack loader, or lowering of the stack.

FIG. 1 shows the stack module according to the present invention for two positions. On the left, the stack has been raised by a bolt BLT which is rotatably mounted in an opening along the middle axis $X_1$, $X_2$ of the apparatus. Bolt BLT applies a force F along the axis and against the weight of the stack through a stack loader SL which engages the bottom of the stack. For the sake of simplicity, stack loader SL is assumed to engage the bottom of the lowest heat sink $HS_7$. As explained hereinafter, the stack loader SL is a telescopic arrangement containing a spring washer (not shown) which can be comprised by turning the bolt BLT further and upward once the upper heat sink $HS_1$ when raised with the stack, has become engaged with the upper. When this is done, the telescopic arrangement (as explained hereinafter) causes the edge $E_1$ of an inner protruding member of the telescopic arrangement to come closer and closer to the edge $E_2$ of the outside wall of the stack loader SL until both edges become aligned. By construction, when this happens, the spring washer contained in the stack loader develops both against the bolt BLT and against the stack, a force which is required for an efficient and safe operation of the stack under current and voltage. A visible color, or marking laterally of the inner protruding member provides a sight which guides the operator adjusting the pressure with the bolt BLT. Without any marking, the operator can also feel merely by touch whether the two edges $E_1$ and $E_2$ are aligned, which is another way to verifying that the force applied to the stack through the stack loader SL by the bolt BLT is exactly right.

On the right of FIG. 1, the stack module is shown in a lowered position. The bolt BLT has been illustratively lowered to such an extent that heat sinks $HS_1$-$HS_4$ are being held back by respective stoppers $STP_1$-$STP_5$. Lowering of the stack by stack loader SL is not enough, though, in the situation shown by FIG. 1 that heat sinks $HS_5$ and $HS_6$ would be held back by stoppers $STP_5$ and $STP_6$, respectively. Accordingly, only electrical devices $ED_1$-$ED_4$ while resting on the adjacent and lower heat sink ($HS_2$-$HS_5$) are separated from the upper heat sink ($HS_1$-$HS_4$). Such separation is sufficient that the operator can remove any of these devices. Indeed, when lowering is limited to the separation of $ED_1$ from $HS_1$, electrical device $ED_1$ is the first, and also the only one, that can be replaced, tested or for any other reason taken away. Further lowering of the stack by bolt BLT and the interposed stack loader SL, will in turn liberate $ED_2$, $ED_3$, and so on until the last which is $ED_6$ when heat sink $HS_6$ engages stopper $STP_6$ and is retained by it. In other words, with bolt BLT, stack loader SL can travel in either direction as much as the distance between $HS_6$ to $STP_6$ on the left of FIG. 1.

Figure 2:
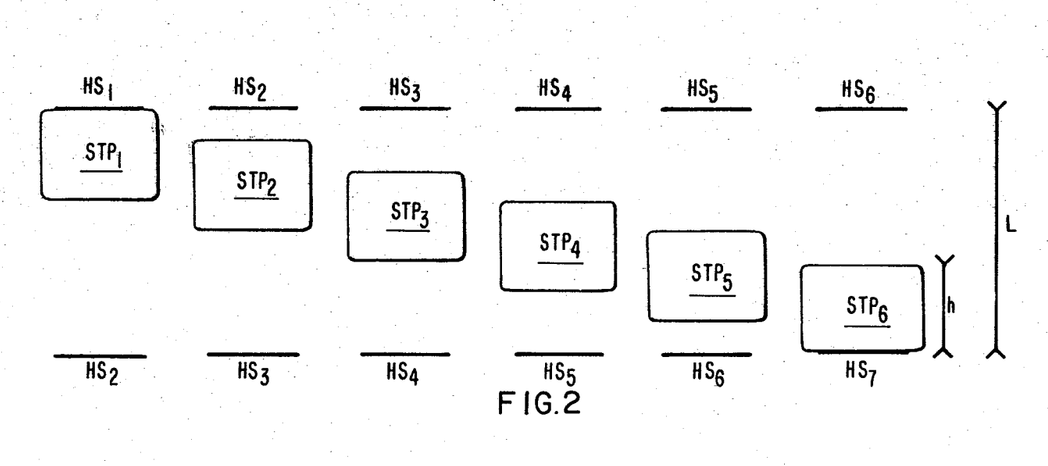
FIG. 2 shows the stoppers according to the invention positioned with respect to the interspace between adjoining upper and lower heat sinks of the stack of FIG. 1.

Referring to FIG. 2, the stoppers $STP_1$-$STP_6$ are shown in relation with the adjoining upper and lower heat sinks at different levels in the interspace $L_1$ separating two consecutive heat sinks. Each stopper is progressively closer to the lower heat sink and further from the upper heat sink in the order of succession of the stoppers. Each stopper has an upper surface which is adapted to engage the upper heat sink, when at a level which is a multiple of L/5. If it is assumed that each stopper has a definite height h to be accommodated within the interspace $L_1$, the stoppers STP are respectively positioned at (L-h)/5, 2(L-h)/5, 3(L-h)/5, 4(L-h)/5, and (L-h) from the upper heat sink. Indeed this is only the preferred embodiment in the instance where six electrical devices are associated with seven interlacing heat sinks. There are other ways of choosing the stopper STP levels in order to selectively liberate one electrical device ED at a time when lowering the stack gradually with the central bolt BLT and the associated stack loader SL mounted on the lower member LM of the stack module. In other words, FIGS. 1 and 2 are only illustrative.

Figure 3:
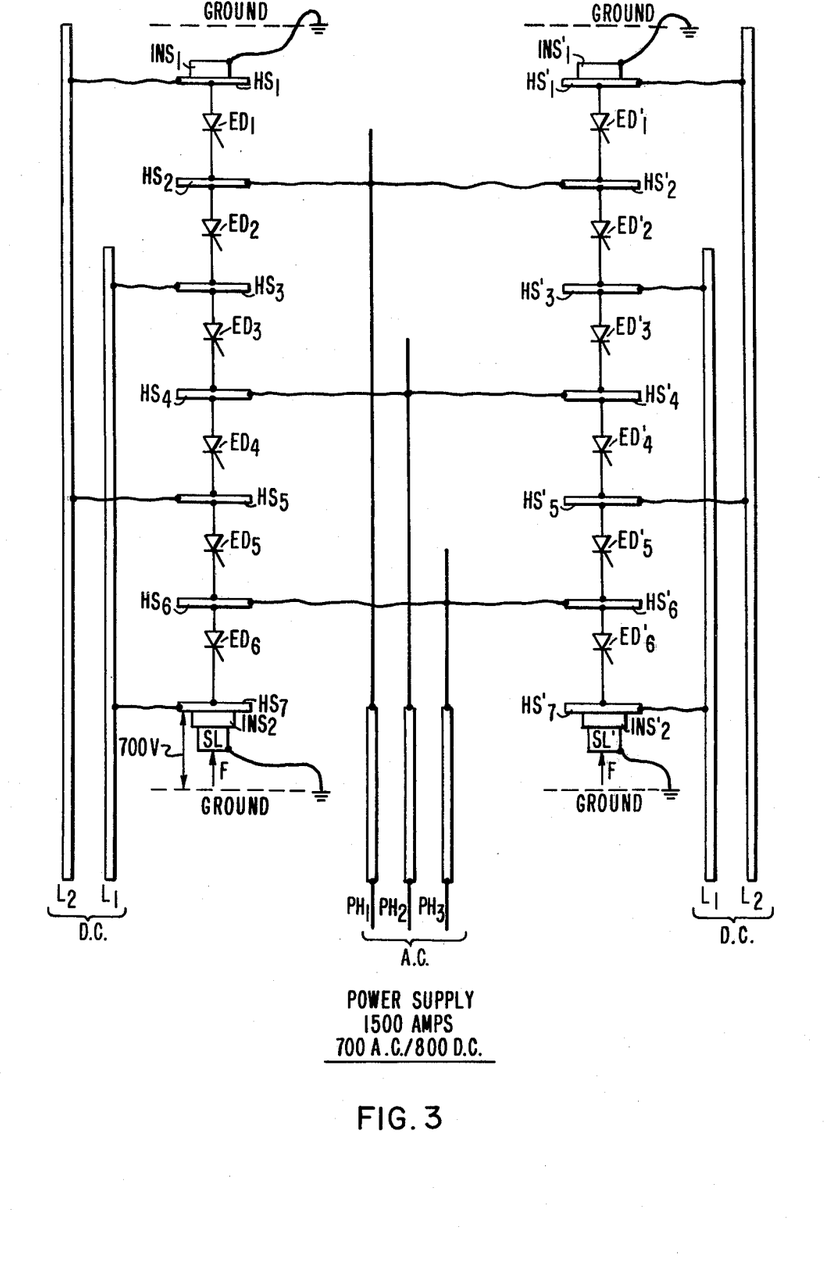
FIG. 3 illustrates the electrical circuit of an AC/DC power supply using a stack of electrical components such as shown in FIG. 1.

Referring to FIG. 3, electrical power apparatus is schematically illustratively shown. It is converted from a 1500 ampere, 700 volts three phase ($PH_1$, $PH_2$, $PH_3$) alternating current into 800 direct current voltage (lines $L_1$, $L_2$). The apparatus includes two stack modules of six thyristors in a bridge ($ED_1$-$ED_6$ on the left; $ED'_1$-$ED'_6$ on the right of FIG. 3), which are each sandwiched between two heat sinks (schematized as $HS_1$-$HS_6$ on the left stack module and $HS'_1$-$HS'_6$ on the right stack module. The electrical device could as well be a diode rather than thyristor. Like for the stack module of FIG. 1, the electrical components are maintained within a frame having upper and lower members such as UM and LM and tension members such as TM in FIG. 1, which for the sake of clarity, are not shown in FIG. 3 for either of the stack modules. A stack loader SL is shown, applying a force F at the bottom of the stack in the left stack module. A similar stack loader SL is also associated with the right stack module.

Because the stack loader SL, its bolt BLT (not shown) and the lower member LM are at ground potential, while the last heat sink $HS_7$ is in the illustrated embodiment, at about 700 volts above ground, the stack loader SL is applied against the bottom of heat sink $HS_7$ through an insulating block $INS_2$ which is so dimensioned as to provide along its outside surfaces a sufficient length for the creeping voltage. Typically, $INS_2$ is a 1-inch thick square of 4 inches on each side. For the same reason, the upper heat sink $HS_1$ similarly engages the upper member UM (not shown) through an insulating block $INS_1$ because it is at ground potential. Blocks $INS_1$ and $INS_2$ typically are made of plastic material which is capable of withstanding the forces applied to the stack under its own weight, as well as under the tightening forces.

The same construction applies to the left stack module of FIG. 3. More generally, the left stack module is a mirror image, as to its construction and its electrical constructions, of the right stack module just described.

Figure 4:
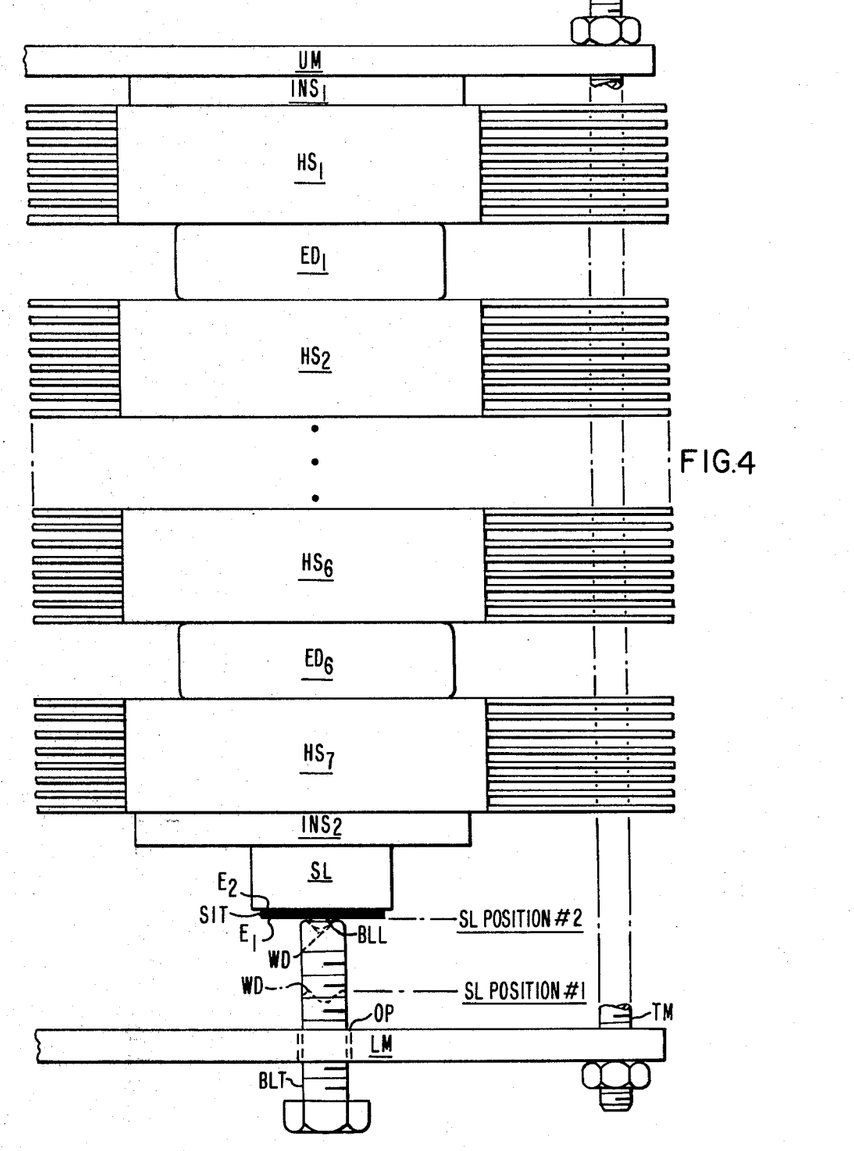
FIG. 4 shows with more detail the heat sinks and their relation with the axis of the vertical tension members of the stack module supporting the stoppers of FIGS. 1 and 2.

Referring to FIG. 4, the stack module of FIG. 1 or FIG. 3 is shown with more details. Typically, the heat sinks HS are made of a core of solid copper cylindrical in shape, 3 inches high and 3 inches in diameter, having laterally and on opposite sides 8 fins, 1.5 inch long also made of thick of solid copper. The fins are soldered or brazed to the surface of the cylindrical core at regularly distributed levels. The cylindrical solid copper core of each heat sink provides an upper and a lower base which comes into contact with an adjacent thyristor or diode ED. Once inserted and pressed by tightening of the stack module with the stack loader SL. This is only exemplary indeed.

In the example shown and with the devices available at present on the market, the thyristor used are typically 1¼ inches high. With such figures, the overall stack represents a combination of seven heat sinks at 20 pounds each and six electrical devices at 2 pounds each, for a total of 140 pounds to be maintained in the support formed by horizontal members UM and LM and vertical members TM. This weight of 140 pounds is also to be raised by the bolt BLT and the stack loader SL up to the upper member UM and it has to be lowered from such higher level by the entire distance of travel (L-h on FIG. 2). The stack loader is a telescoping arrangement capable of conveying this weight against the tip of the bolt BLT. The tension members TM are made of SAE steel grade 5, connected with the upper and lower members UM, LM by high strength nuts and bolts, as shown in FIG. 1.

Figure 5:
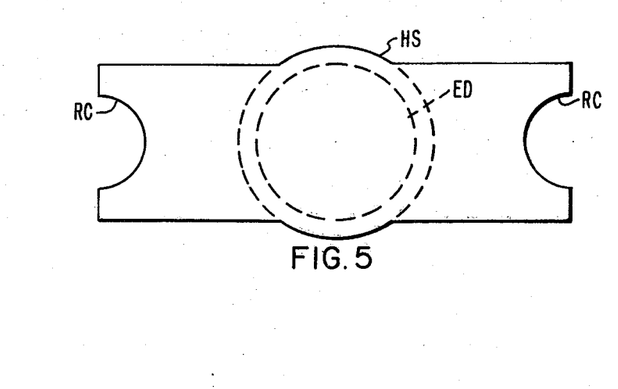
FIG. 5 is a plane view from the top of a heat sink.

As shown in FIG. 5, the fins of the heat sinks HS of FIG. 4 have a recess RC in the form of a half circle at their extremities on both sides of the central core. This recess is provided in order to accommodate the vertical members TM with an appropriate insulation, while leaving between heat sinks sufficient surface which the adjacent stopper STP can engage when the stack is lowered as shown for five stoppers on the right side of FIG. 1.

Figure 6A:
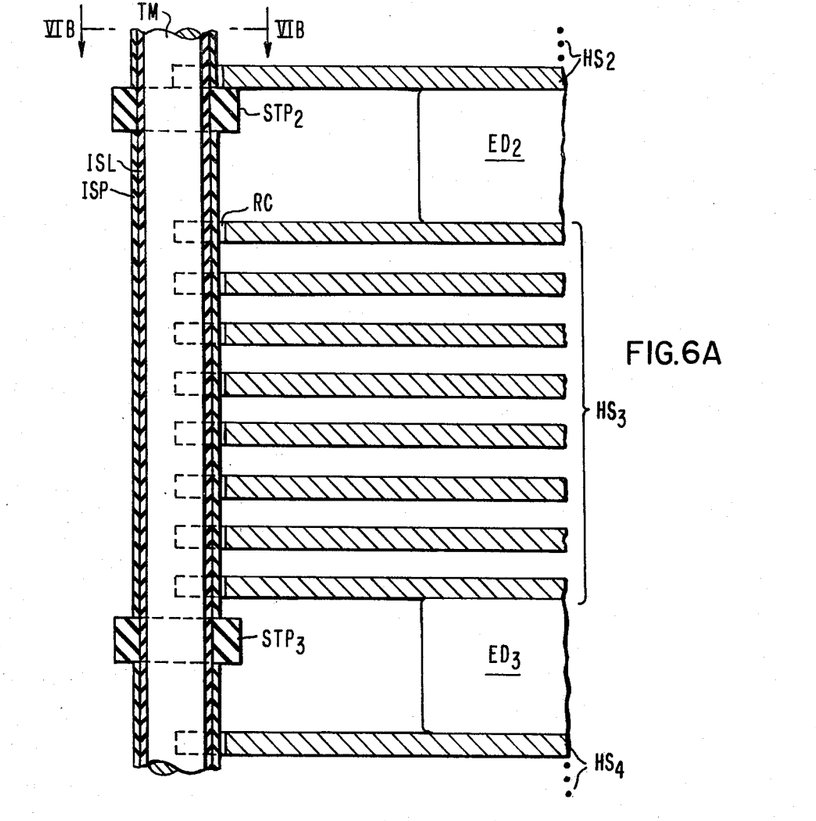
FIG. 6A is a cross section of a heat sink, its fins, the electrical device and the associated vertical member to show their relation with the upper and lower stoppers.

FIG. 6A shows the mechanical and electrical relations between one vertical member TM, made of steel and at ground potential, and the recess RC of the fins of a heat sink HS.

Figure 6B:
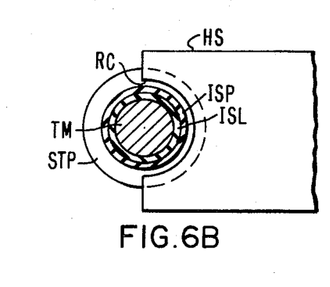
FIG. 6B is a cross section of a vertical tension member of the module in a plane above a heat sink.

Typically, the vertical member TM in the instance like the ones of FIGS. 1, 3 and 4, is half an inch in diameter. An insulating sleeve ISL, ⅛ of an inch thick has been passed around member TM which extends all the way between the upper and lower members UM, LM. Stoppers STP are typically ⅜ inch high and ¼ inch outside diameter. They rest upon an insulating sleeve ISP serving as a spacer between the stoppers. The length of sleeve ISP varies in accordance with the intended spacing between stoppers as illustrated in FIG. 2. FIG. 6B shows in cross section a vertical tension member TM of FIG. 6A in a horizontal plane passing between heat sinks in the absence of any electrical device therebetween. The insulating sleeve ISP has sufficient mechanical strength to support the upper heat sink when it comes to rest by its own weight upon the adjacent stopper STP. The insulating sleeve ISP is also ⅛ of an inch thick and has at least ⅝ inch in diameter so as to accommodate inside the vertical member TM and its insulating sleeve ISL.

FIG. 4 also shows the stack loader SL. The stack loader consists of two parts telescopically arranged against a common inner spring washer. The two parts have visible edges $E_1$ for the outside part, $E_2$ for the upper part. A dark surface with a lateral wall of the projection extending beyond edge $E_2$ provides a sight ST. This is assuming that the bolt BLT has not been advanced forward and against the stack and upper member UM to the point where it compresses the spring washer inside the stack loader and brings the telescopic arrangement to a point where edges $E_1$ and $E_2$ become confounded, e.g. flush. Bolt BLT is applied against the stack loader through a ball bearing BLL which is engaged by a cone-like surface WD at the tip of the bolt BLT. Bolt BLT has a fine thread engaged into a complementary thread of a central opening OP provided in the low member LM and along the axis of the stack loader SL, the insulator $INS_2$ and the overall stack. From the position #2 shown in FIG. 6 where the bolt has raised the stack until it merely engages the upper member UM through its upper insulator $INS_1$ (thus without applying any more pressure on the inner spring washers of the stack loader SL) the bolt BLT can be unscrewed downward until a position or initial position #1 is reached, as shown in dotted line, for which all the stoppers of FIG. 1 have in fact liberated all the electrical devices $ED_1$–$ED_6$. Otherwise, from position #2, the bolt BLT can be tightened upward so that through ball BLL and the stack loader, the inner sping is compressed and develops a force which is distributed between all the components of the stack. The spring washer is calibrated inside the stack loader so that while the telescopic arrangement collapsed under the force exerted by the ball bearing BLL, the desired force is obtained when edge $E_1$ is aligned with edge $E_2$. In other words, the sight SIT will have disappeared, or by mere touch, the two edges will be in the same plane.

Figure 7:
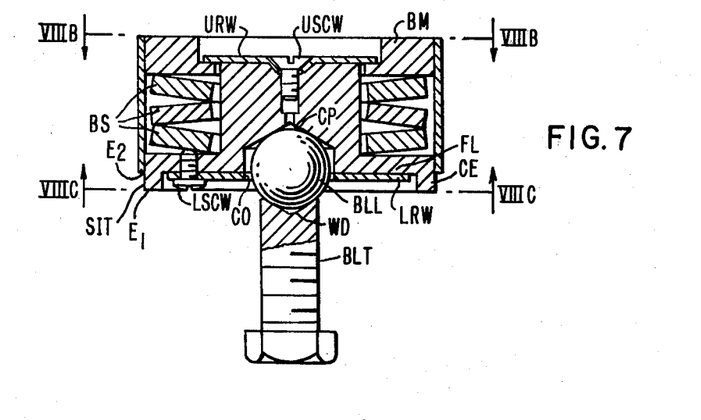
FIG. 7 illustrates by a side view the bolt and the stack loader according to the invention when in engagement to one another.
Figure 8A:
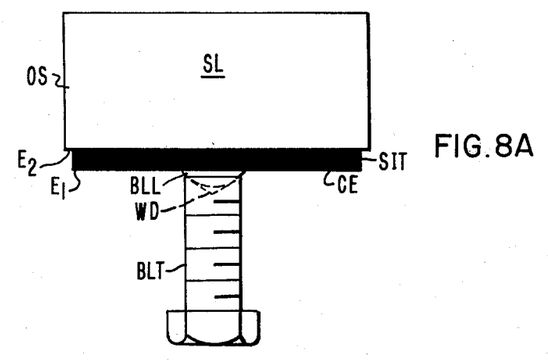
FIG. 8A is a cross section of the stack loader.
Figure 8B:
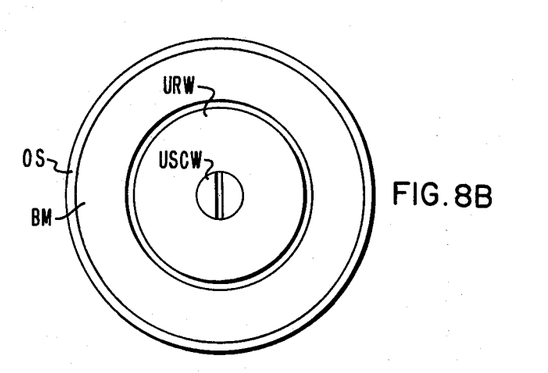
FIGS. 8B and 8C are views of the stack loader from the top and from the bottom, respectively.
Figure 8C:
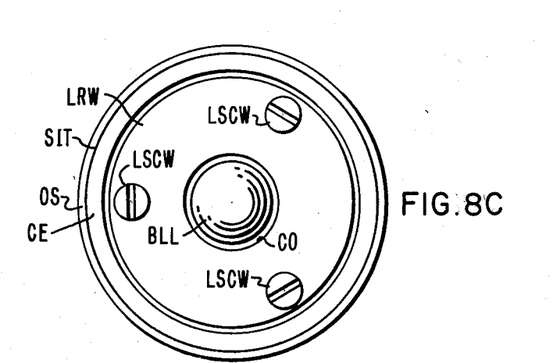

Referring to FIGS. 7, 8A, 8B and 8C, the stack loader SL will now be described in detail in its relation with bolt BLT. FIG. 7 is a vertical view of the stack loader with the bolt BLT applied to its base. The stack loader SL of FIG. 7 appears in cross section in FIG. 8A. The stack loader essentially consists of two parts BMOS and CE. Mounted telescopically one into the other with a spring BS in between. The first part is a base member BM. The second part is a centering cup member. These are on two opposite sides of three Belleville springs BS laying upon each other at opposite angles from one to the next. The centering cup member has a cup CP in which a ball BLL rests. The ball bearing transmits the force from the conical tip WD of bolt BLT to the centering cup. The centering cup in turn transmits the force through the Belleville springs to the base member BM which normally engages the stack, typically the lower insulator $INS_2$ of FIG. 4. An upper and a lower retaining washer (URW, LRW) are fixed by screws SCW at opposite sides of the centering cup member CCM. The centering cup member has a central portion CEP extending into the central space of the Belleville springs to provide centering thereof. The upper retaining washer fixed by a screw to the central position CEP at the center thereof in order to retain the base member in alignment and against the Belleville springs from the top. The centering up member CP has a circular flange FL extending radially with the same dimetrical dimension as the base member BM. Flange FL protrudes by a cylindrical extension CE having an edge E. An outer shell BS is brazed or soldered around the base member BM providing an apron-like cylindrical extension or casing which has the same diameter internally as the outer diameter of the base member BM and the cylindrical extension CE of flange FL. The outer shell has an edge $E_2$. A colored marking on the outside of the cylindrical extension CE provides a sight SIT as shown in FIGS. 1 and 4. The lower retaining washer LRW as shown in FIG. 8C has a central opening CO and is fixed by three screws SCW to the lower part of the centering cup member CCM in order to maintain the ball BLL in its cup CP, while allowing the ball BLL to extend downward through the central opening CO.

FIGS. 8A, 8B and 8C are outside views of the stack loader. FIG. 8A is a side view of the stack loader with its bolt BLT. FIG. 8B is a view of the stack loader from above. FIG. 8C is a view from below. Referring again to FIG. 7, it is seen that when the stack loader is pressed by its base member against the bottom of the stack in the module assembly, and the stack has been raised by bolt BLT up to position #2 of FIG. 5, further screwing action bolt BLT will result in compressing the Belleville springs BS. In the process, edge $E_1$ of cylindrical extension CE comes close and closer to edge $E_2$ of the outer shell OS.

As an illustration of the response characteristic of such a stack loader, the following Table indicates the deflections as a function of the load applied by the bolt BLT:

TABLE

| LOAD (pounds) | DEFLECTION (in inches) |
| --- | --- |
| 3160 | .0411 |
| 6195 | .0822 |
| 9127 | .1233 |
| 12000 | .1655 |

We claim:

1. In a frame assembly holding together under pressure along a longitudinal axis a stack of electrical components including a plurality of semiconductor devices and of heat sinks arranged in pairs so that two heat sinks per semiconductor device are adjacent opposite sides thereof, the combination of:

an upper end member disposed transversely of said longitudinal axis above said stack;

a base plate normally in engagement with the lower end of said stack;

a lower end member disposed transversely of said longitudinal axis below said stack and said base plate;

said lower end member having a threaded central opening aligned with said longitudinal axis;

bolt means operatively mounted through said threaded central opening of said lower end member and engaging said base plate for applying pressure to said stack therethrough and against said upper end member;

tension members mounted laterally of said stack and connecting said upper and lower end members;

said bolt means being adjustable between an upper extreme position for which said stack is under pressure and a withdrawn extreme position away from said upper extreme position, said stack being lowered under gravity when said bolt means is moved from said upper to said withdrawn extreme position;

at least one of said tension members having a plurality of vertically spaced stoppers matching in number the number of heat sinks laying immediately above each semi-conductor device in said stack, said stoppers being increasingly spaced from one another downward along the associated tension member and being adapted to retain a corresponding one of said number of heat sinks when said stack is lowered by said bolt means from said upper extreme position, thereby to open said stack and allow a selected semi-conductor device to be removed and replaced immediately below a retained heat sink.

2. The frame assembly of claim 1 with said stoppers being spaced vertically from one another in accordance with an arithmetic progression.

* * * * *